(12) United States Patent
Lei (10) Patent No.: US 12,543,300 B2
(45) Date of Patent: Feb. 3, 2026

(54) ELECTRO-STATIC DISCHARGE PROTECTION STRUCTURE AND ELECTRONIC DEVICE (71) Applicant: Honor Device Co., Ltd., Shenzhen (CN)

(72) Inventor: Fenxing Lei, Shenzhen (CN)

(73) Assignee: HONOR DEVICE CO., LTD., Shenzhen (CN)

(*) Notice: Subject to any disclaimer, the term of this patent is extended or adjusted under 35 U.S.C. 154(b) by 218 days.

(21) Appl. No.: 18/279,668

(22) PCT Filed: Apr. 19, 2022

(86) PCT No.: PCT/CN2022/087626
§ 371 (c)(1),
(2) Date: Aug. 31, 2023

(87) PCT Pub. No.: WO2023/024534
PCT Pub. Date: Mar. 2, 2023

(65) Prior Publication Data
US 2024/0314989 A1    Sep. 19, 2024

(30) Foreign Application Priority Data

Aug. 27, 2021 (CN) .......................... 202110992317.8

(51) Int. Cl.
H05K 9/00    (2006.01)
H04M 1/02    (2006.01)

(52) U.S. Cl.
CPC ........ *H05K 9/0067* (2013.01); *H04M 1/0249* (2013.01); *H04M 1/0266* (2013.01)

(58) Field of Classification Search
CPC . H05K 9/0067; H04M 1/0249; H04M 1/0266
See application file for complete search history.

(56) References Cited

U.S. PATENT DOCUMENTS 4,925,400 A * 5/1990 Blair .................. H01R 13/6485
                                            29/842
6,028,761 A * 2/2000 Cooter .................... H05F 3/02
                                            340/649
(Continued)

FOREIGN PATENT DOCUMENTS

CN    201248189 Y    5/2009
CN    201263150 Y    6/2009
(Continued)

OTHER PUBLICATIONS

Chu Jianmin, "Electrostatic discharge protection design for electronic products", Electronic Engineer, 1999(08), 6 pages.
(Continued)

Primary Examiner — Sean Kayes
Assistant Examiner — Samantha L Faubert
(74) Attorney, Agent, or Firm — Slater Matsil, LLP (57) ABSTRACT This application illustrates an electro-static discharge protection structure and an electronic device. One end of a pressure-sensitive elastic component is connected to a metal housing, the other end of the pressure-sensitive elastic component extends in a direction away from the metal housing. A border frame includes a connection part—and a first side edge. A conductive layer is disposed on a side, facing the pressure-sensitive elastic component, of the connection part. The one end of the pressure-sensitive elastic component—is connected to the conductive layer, and the other end of the pressure-sensitive elastic component is connected to the metal housing.

19 Claims, 9 Drawing Sheets

(56) References Cited

U.S. PATENT DOCUMENTS

| | | | |
|---|---|---|---|
| 7,248,455 B2* | 7/2007 | Brodsky | H01R 13/6485 361/220 |
| 8,238,071 B2* | 8/2012 | Weng | H05K 9/0067 361/220 |
| 8,238,087 B2* | 8/2012 | McClure | H05K 1/0281 292/196 |
| 9,541,405 B2 | 1/2017 | An et al. | |
| 10,854,362 B2* | 12/2020 | Lim | H01R 13/2414 |
| 11,330,743 B2* | 5/2022 | Park | H05K 9/0067 |
| 11,381,895 B2 | 7/2022 | Seo et al. | |
| 12,128,766 B2* | 10/2024 | Iwasawa | G02F 1/133308 |
| 2008/0081273 A1 | 4/2008 | Murakami et al. | |
| 2013/0329460 A1 | 12/2013 | Mathew et al. | |
| 2016/0302333 A1* | 10/2016 | Tobinaga | G06F 1/1637 |
| 2016/0351557 A1 | 12/2016 | Weyers | |
| 2019/0097363 A1 | 3/2019 | Cho et al. | |
| 2019/0174623 A1* | 6/2019 | Owaki | H04N 23/52 |
| 2020/0051466 A1 | 2/2020 | Inoue et al. | |
| 2021/0168230 A1* | 6/2021 | Baker | G06F 1/1635 |

FOREIGN PATENT DOCUMENTS

| | | |
|---|---|---|
| CN | 102111948 A | 6/2011 |
| CN | 202067055 U | 12/2011 |
| CN | 202406151 U | 8/2012 |
| CN | 106161744 A | 11/2016 |
| CN | 108023978 A | 5/2018 |
| CN | 207531214 U | 6/2018 |
| CN | 207664354 U | 7/2018 |
| CN | 108391191 A | 8/2018 |
| CN | 108615967 A | 10/2018 |
| CN | 108769315 A | 11/2018 |
| CN | 208413398 U | 1/2019 |
| CN | 110233915 A | 9/2019 |
| CN | 212102676 U | 12/2020 |
| CN | 112689034 A | 4/2021 |
| CN | 112993606 A | 6/2021 |
| CN | 213958451 U | 8/2021 |
| CN | 113853053 A | 12/2021 |
| GB | 2389719 A | 12/2003 |
| JP | 2005123001 A | 5/2005 |
| KR | 101704644 B1 | 2/2017 |
| WO | 2017204584 A1 | 11/2017 |

OTHER PUBLICATIONS

A. Clerici, R. Chiumeo and C. Gandolfi, "MVDC solid-state breaker Control Optimization by Real Time Control Hardware in The Loop tests," 2020 IEEE International Conference on Environment and Electrical Engineering and 2020 IEEE Industrial and Commercial Power Systems Europe (EEEIC / I&CPS Europe), Madrid, Spain, Jun. 9-12, 2020 pp. 1-6.

Liu et al., "ESD Protection For Mobile Phone", Safety and electromagnetic compatibility, 2005(06), 8 pages.

* cited by examiner

ELECTRO-STATIC DISCHARGE PROTECTION STRUCTURE AND ELECTRONIC DEVICE

CROSS-REFERENCE TO RELATED APPLICATIONS

This application is a national stage of International Application No. PCT/CN2022/087626, filed on Apr. 19, 2022, which claims priority to Chinese Patent Application No. 202110992317.8, filed on Aug. 27, 2021. The disclosures of both of the aforementioned applications are hereby incorporated by reference in their entireties.

TECHNICAL FIELD

This application relates to the field of electro-static discharge protection technologies, and in particular to an electro-static discharge protection structure and an electronic device.

BACKGROUND

In an electronic device such as a mobile phone, there may be static electricity on a side edge of a screen module. Electro-static discharge may cause frequent freezing, automatic power-off, poor image quality and volume, unstable signal quality, and the like of the mobile phone. Therefore, the electro-static discharge (Electro-Static discharge, ESD) has become important content for quality control of an electronic product.

An existing electro-static discharge protection strategy applied to the electronic device mainly includes insulation and grounding. When electro-static discharge protection is performed by insulation, a border frame is bonded to the screen module with solid adhesive. The solid adhesive has high compactness and is not easily broken down by the static electricity. Electro-static discharge protection is mainly performed by grounding in the following two ways. In a first way, an electro-static discharge protection structure is fastened to a metal housing of an electronic device with conductive adhesive, to discharge static electricity by grounding. In a second way, the electro-static discharge protection structure discharges static electricity to the metal housing in a manner of discharge in a gap.

However, the following problems exist in the foregoing two ways. When the electro-static discharge protection is performed by insulation, because insulation performance completely depends on a width of the adhesive, to achieve a good insulation effect, a width of a black edge of a screen may increase and affect appearance of the electronic device. When the electro-static discharged protection is performed by grounding, in the first grounding manner, conductive adhesive is dispensed to ensure stability of the electro-static discharge protection structure. This increases the width of the black edge of the screen. In addition, this grounding manner may cause a risk of radiated spurious emission (Radiated Spurious Emission, RSE) to an antenna due to poor grounding, and affect antenna performance. In the second grounding manner, the discharge in a gap may cause a risk of secondary discharge.

SUMMARY

Embodiments of this application provide an electro-static discharge protection structure and an electronic device, to prevent, without affecting antenna performance, risks of RSE and secondary discharge caused by poor grounding.

According to a first aspect, this application provides an electro-static discharge protection structure. One end of a pressure-sensitive elastic component is connected to a metal housing, the other end of the pressure-sensitive elastic component extends in a direction away from the metal housing, and a screen module is disposed on a side of the pressure-sensitive elastic component. A border frame includes a connection part and a first side edge. The connection part is disposed at one end, away from the metal housing, of the pressure-sensitive elastic component. The connection part includes a first surface facing the screen module. The first side edge is disposed on a side, facing the screen module, of the connection part. The first side edge includes a second surface facing the screen module. A conductive layer is disposed on a side, facing the pressure-sensitive elastic component, of the connection part, the one end of the pressure-sensitive elastic component is connected to the conductive layer, the other end of the pressure-sensitive elastic component is connected to the metal housing, and the conductive layer also continuously extends along the first surface to the second surface.

According to the electro-static discharge protection structure provided in this application, when there is no static electricity, the pressure-sensitive elastic component may be conductive only at a high voltage. Therefore, a low voltage current may not be conducted to a metal partition wall through the pressure-sensitive elastic component. This prevents an RSE risk caused by conventional poor grounding, and further prevents affecting of antenna performance. When the static electricity enters a side edge of the screen module, because of a high voltage of the static electricity, the static electricity is conducted to the pressure-sensitive elastic component through the conductive layer, and then conducted to the metal housing, thereby being discharged by grounding. It should be noted that the pressure-sensitive elastic component includes a pressure-sensitive device and an elastic conductor. The pressure-sensitive device is a device that can clamp a voltage when a circuit bears an overvoltage. The pressure-sensitive device is not conductive when there is no static electricity, and is conductive when there is the static electricity. Therefore, after the static electricity is conducted, a clamping voltage is extremely small, so that a peak current caused by secondary discharge is reduced, and a risk of the secondary discharge is prevented. The elastic conductor may absorb a gap tolerance. This improves reliability of overlapping, and reduces damage of a structural stress to the pressure-sensitive device.

In an implementation, the metal housing includes a metal partition wall. One end of the metal partition wall is connected to the metal housing, the other end of the metal partition wall extends in the direction away from the metal housing, and the pressure-sensitive elastic component is connected to one end, away from the metal housing, of the metal partition wall. A height of the metal partition wall may be arbitrarily set, and may be clamped to the border frame, to fasten the border frame.

In an implementation, the metal housing and the metal partition wall are integrally formed. In this way, in a process of manufacturing an electronic device, the metal housing and the metal partition wall may be integrally poured, to simplify a manufacturing process is simple. In addition, the metal housing and the metal partition wall are integrally poured and tightly connected. Therefore, when the static electricity is conducted, the static electricity is directly conducted to the metal housing through the metal partition wall, and discharged by grounding, so that a grounding effect is good.

In an implementation, the border frame further includes a second side edge. The second side edge is disposed on a side, opposite to the screen module, of the metal partition wall. One end of the second side edge is connected to the connection part, and the other end of the second side edge extends in a direction close to the metal housing. The second side edge may be configured to be clamped to the metal partition wall.

In an implementation, the connection part includes a junction surface attached to the metal housing. A groove is disposed on the junction surface, and the conductive layer is disposed at a bottom of the groove. The pressure-sensitive device and the elastic conductor are disposed in the groove. One end of the pressure-sensitive device is connected to the conductive layer in the groove, the other end of the pressure-sensitive device is connected to one end of the elastic conductor, and the other end of the elastic conductor is connected to the metal housing. In the implementation, the pressure-sensitive elastic component may be disposed on the border frame. When the static electricity enters from the side edge of the screen, the static electricity is conducted to the pressure-sensitive device through the conductive layer, then conducted to the metal housing through the elastic conductor, and discharged by grounding. In the disposing manner, no metal partition wall is disposed, the elastic conductor is directly connected to the metal housing, the pressure-sensitive elastic component may be fastened in a gap formed by the second side edge, the connection part, and the screen module. In the disposing manner, the static electricity is directly conducted to the pressure-sensitive device, so that the pressure-sensitive device has a better effect of clamping the voltage.

In an implementation, an end surface is formed at the one end, away from the metal housing, of the metal partition wall. The connection part includes a junction surface attached to the end surface. A groove is disposed on the junction surface. The conductive layer is disposed at a bottom of the groove. The pressure-sensitive device and the elastic conductor are disposed in the groove. One end of the pressure-sensitive device is connected to the conductive layer in the groove, the other end of the pressure-sensitive device is connected to one end of the elastic conductor, and the other end of the elastic conductor is connected to the end surface. In the disposing manner, because the metal partition wall is disposed in this manner, and the metal partition wall may be clamped to the second side edge to fasten the border frame, the elastic conductor is directly connected to an end surface of the metal partition wall. In the disposing manner, the static electricity is directly conducted to the pressure-sensitive device, so that the pressure-sensitive device has a better effect of clamping the voltage.

In an implementation, an end surface is formed at the one end, away from the metal housing, of the metal partition wall. The connection part includes the junction surface attached to the end surface. A groove is disposed on the end surface. The conductive layer is disposed at a top of the groove. The pressure-sensitive device and the elastic conductor are disposed in the groove. One end of the pressure-sensitive device is connected to a bottom of the groove, the other end of the pressure-sensitive device is connected to one end of the elastic conductor, and the other end of the elastic conductor is connected to the conductive layer. In the implementation, the pressure-sensitive elastic component may be disposed on the metal partition wall. Because the metal housing, the metal partition wall, and the groove disposed on the metal partition wall may be integrally poured in an actual manufacturing process, this manner is simpler in the manufacturing process.

In an implementation, the border frame includes at least any one of the following materials: a metal material and an insulating material. In the manufacturing process, the border frame of the electronic device may be manufactured based on needs of different user groups. The electro-static discharge protection structure illustrated in this application may be applied to a variety of materials of the border frame. A metal border frame may improve overall texture of the electronic device, an insulation border frame may provide a better radio frequency radiation capability and reduce an impact on the antenna performance.

In an implementation, the conductive layer is disposed in at least any one of the following manners: spraying, transferring, and electroplating. In the implementation, in the actual manufacturing process, the conductive layer may be disposed based on a shape and a material of the electronic device.

In an implementation, the pressure-sensitive device includes at least any one of the following materials: a transient diode and a pressure-sensitive resistor. The transient diode is a high-performance protection device in a form of a diode, with characteristics of fast response time, high transient power, a low leakage current, and a small breakdown voltage deviation. The pressure-sensitive resistor may perform effective high-voltage transient voltage suppression, so that costs of the device are effectively reduced and an overall design is optimized.

In an implementation, the elastic conductor includes at least any one of the following materials: conductive foam and silicone. In the implementation, a plurality of materials may be selected as materials of the elastic conductor.

In an implementation, the conductive layer includes at least any one of the following materials: conductive silver paste, a conductive copper sheet, conductive graphite, and conductive fabric. In this way, based on specific disposing of the electro-static discharge protection structure, a plurality of materials may be selected as materials of the conductive layer.

In an implementation, the second side edge further includes a third surface. The third surface is disposed on a side, facing the metal housing, of the second side edge. There is a gap between the third surface and the metal housing. In the implementation, the pressure-sensitive elastic component is disposed between the connection part and the metal partition wall, so that the pressure-sensitive elastic component is not conductive when there is no static electricity, and is conductive when there is the static electricity, and the metal partition wall plays a role in clamping. Therefore, the third surface does not need to be closely attached to the metal housing, and the border frame and the metal housing do not need to be fastened with adhesive. When the metal partition wall performing clamping, the metal partition wall is not conductive when there is no static electricity. This prevents an increase of a width of a black edge of a screen caused when the metal partition wall fastened to the metal housing with conductive adhesive, and prevents a problem of an RSE risk possibly caused by poor grounding with the conductive adhesive and further prevents affecting of antenna performance.

In an implementation, an antenna area is disposed on a side, opposite to the screen module, of the border frame. Due to a demand for a signal strength, an antenna is usually disposed near the border frame. An antenna area is disposed near the border frame, so that better radio frequency radiation is provided.

According to a second aspect, this application further provides an electronic device. The electronic device includes the electro-static discharge protection structure according to the first aspect and any one of the implementations in the first aspect.

According to the electronic device provided in this application, when there is no static electricity, the pressure-sensitive elastic component may be conductive only at a high voltage, Therefore, a low voltage current may not be conducted to the metal partition wall through the pressure-sensitive elastic component. This prevents an RSE risk caused by conventional poor grounding, and further prevents affecting of antenna performance. When the static electricity enters a side edge of the screen module, because of a high voltage of the static electricity, the static electricity is conducted to the pressure-sensitive elastic component through the conductive layer, and then conducted to the metal housing, thereby being discharged by grounding.

DETAILED DESCRIPTION OF ILLUSTRATIVE EMBODIMENTS

In an electronic device such as a mobile phone, there may be static electricity on a side edge of a screen module. An electro-static sensitive area is disposed on one side edge of the screen module, and the static electricity easily enters along the side edge of the screen module and is transmitted to other areas through a conductive layer. Static electricity has characteristics of long-time accumulation, a high voltage, a low battery level, a small current, and a short action event. Electro-static discharge may cause frequent freezing, automatic power-off, poor image quality and volume, unstable signal quality, and the like of the mobile phone. Therefore, ESD has become important content for quality control of an electronic product. ESD certification is to be performed in a process of launching an electronic device on the market. Therefore, electro-static discharge protection is important to the electronic device. An existing strategy to resolve the static electricity is insulation or grounding.

When electro-static discharge protection is performed by insulation, a border frame is bonded to a metal housing with solid adhesive. The solid adhesive has high compactness and is not easily broken down by the static electricity.

Figure 1:
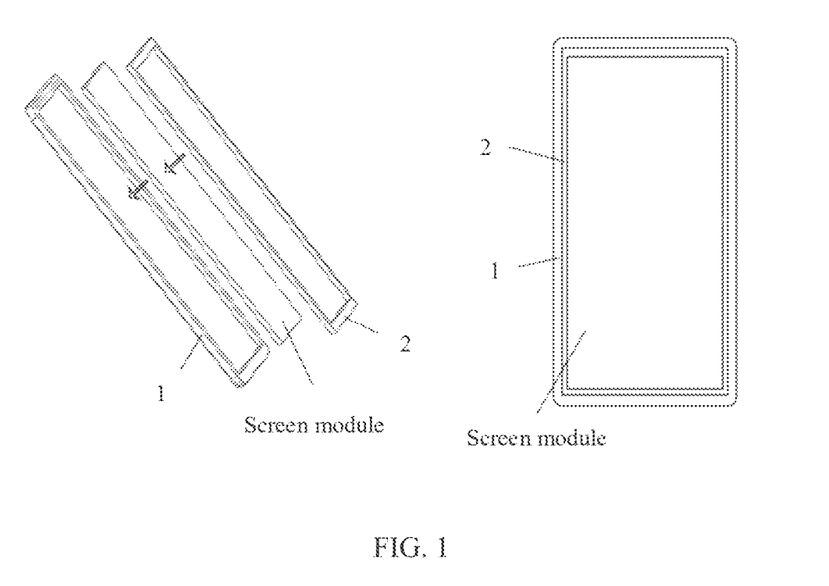
FIG. 1 is a diagram of an assembly scenario of a screen module according to this application.

FIG. 1 is a diagram of an assembly scenario of a screen module according to this application. As shown in FIG. 1, first, the screen module is assembled into a metal housing 1. Then the screen module is clamped on the metal housing 1 through a border frame 2. In addition, the border frame 2 may also cover a gap formed between the screen module and the metal housing 1.

Figure 2:
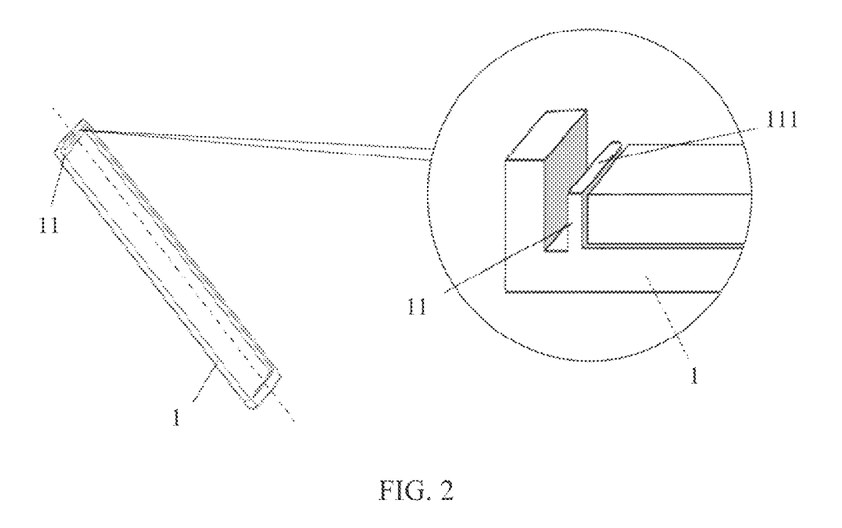
FIG. 2 is a schematic diagram of a metal housing according to an embodiment of this application.

FIG. 2 is a schematic diagram of a metal housing according to an embodiment of this application. As shown in FIG. 2, the metal housing 1 may include a metal partition wall 11. One end of the metal partition wall 11 is connected to the metal housing 1, and the other end of the metal partition wall 11 extends in a direction away from the metal housing 1. An end surface 111 is formed at one end, away from the metal housing 1, of the metal partition wall 11. The metal partition wall 11 matches with the border frame 2 to fasten a screen module to the metal housing 1.

Figure 3:
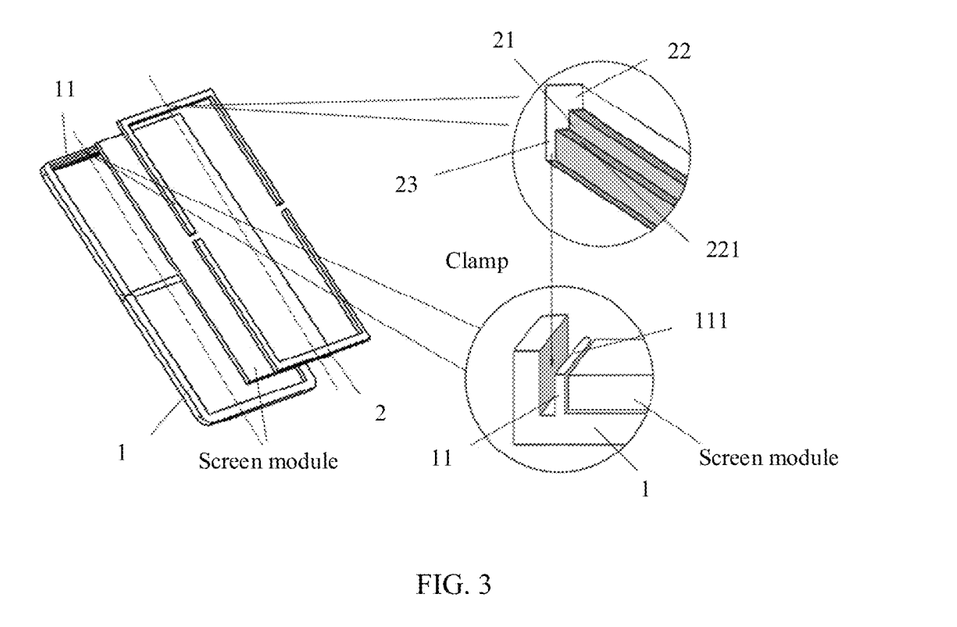
FIG. 3 is a schematic sectional view of assembly of a screen module according to this application.
Figure 4:
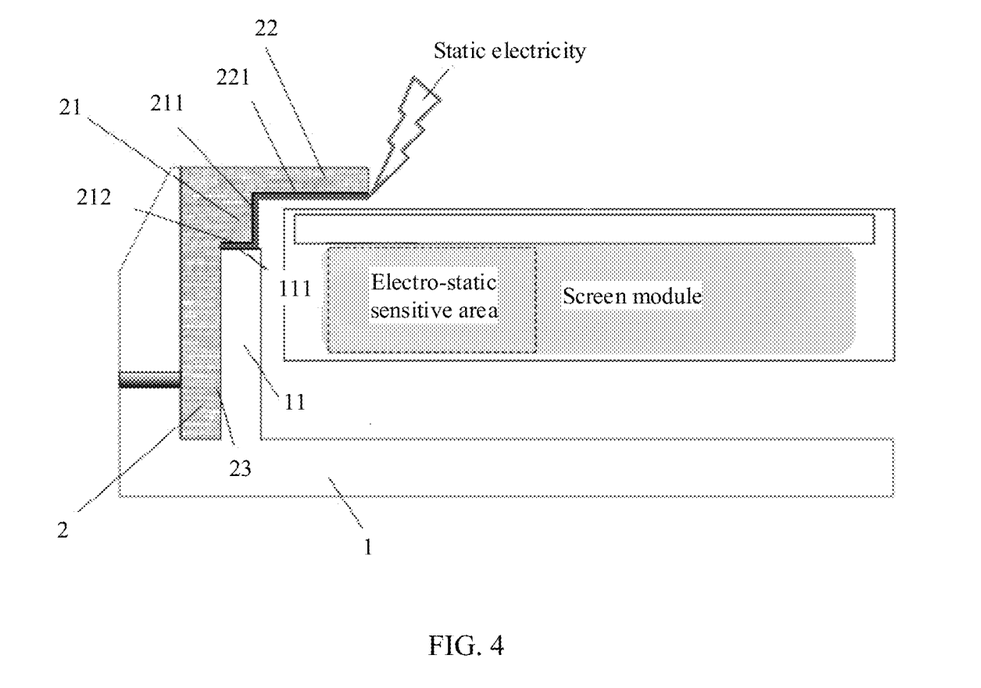
FIG. 4 is a schematic diagram of a specific disposing manner of assembly of a screen module according to this application.

FIG. 3 is a schematic sectional view of assembly of a screen module according to this application. FIG. 4 is a schematic diagram of a specific disposing manner of assembly of a screen module according to this application. As shown in FIG. 3 and FIG. 4, it may be learned, when split along dotted lines in FIG. 3, a screen module is disposed on a side of a metal partition wall 11. A side of a border frame 2 is used as an example. The border frame 2 includes: a connection part 21, a first side edge 22, and a second side edge 23. The connection part 21 is disposed at one end, away from the metal housing 1, of the metal partition wall 11. The connection part 21 includes a first surface 211 facing the screen module and a junction surface 212 facing one side of the metal housing 1. The first side edge 22 is disposed on a side, facing the screen module, of the connection part 21. The first side edge 22 includes a second surface 221 facing the screen module. The second side edge 23 is disposed on a side, opposite to the screen module, of the metal partition wall 11. A continuous conductive layer is disposed on the junction surface 212, the first surface 211, and the second surface 221, and used to conduct static electricity. The junction surface 212 is connected to the end surface 111 and used to conduct the static electricity. The first side edge 22 is used to fasten the screen module, and the second side edge 23 is clamped to a groove formed by the metal partition wall 11 and the metal housing 1. It should be noted that, as shown in a dashed-line box in FIG. 4, an electro-static sensitive area is disposed on a side of a side edge of the screen module, so that the static electricity easily enters along the side edge of the screen module.

Figure 5:
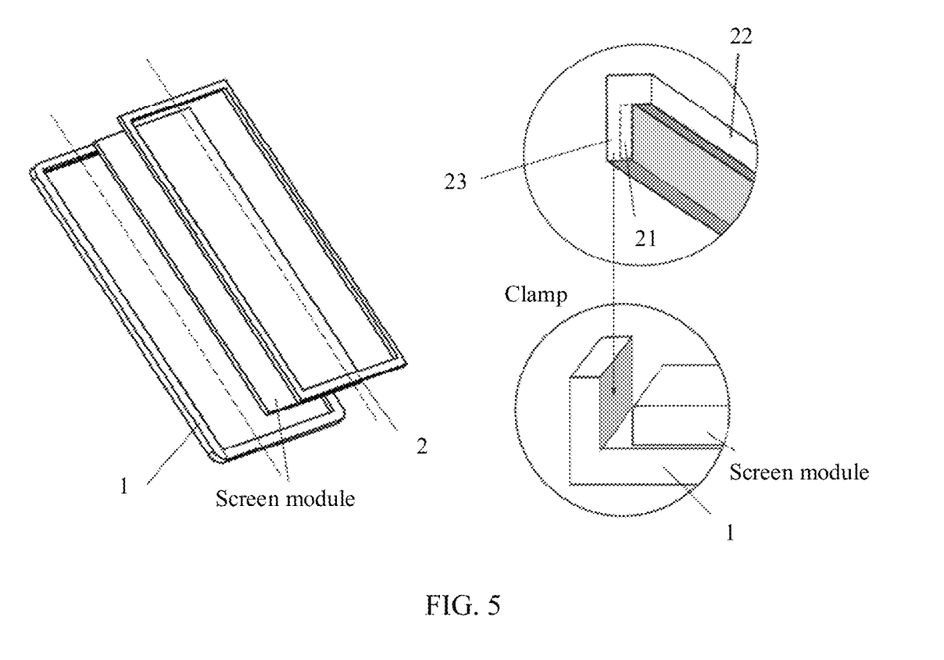
FIG. 5 is a schematic sectional view of assembly of another screen module according to this application.
Figure 6:
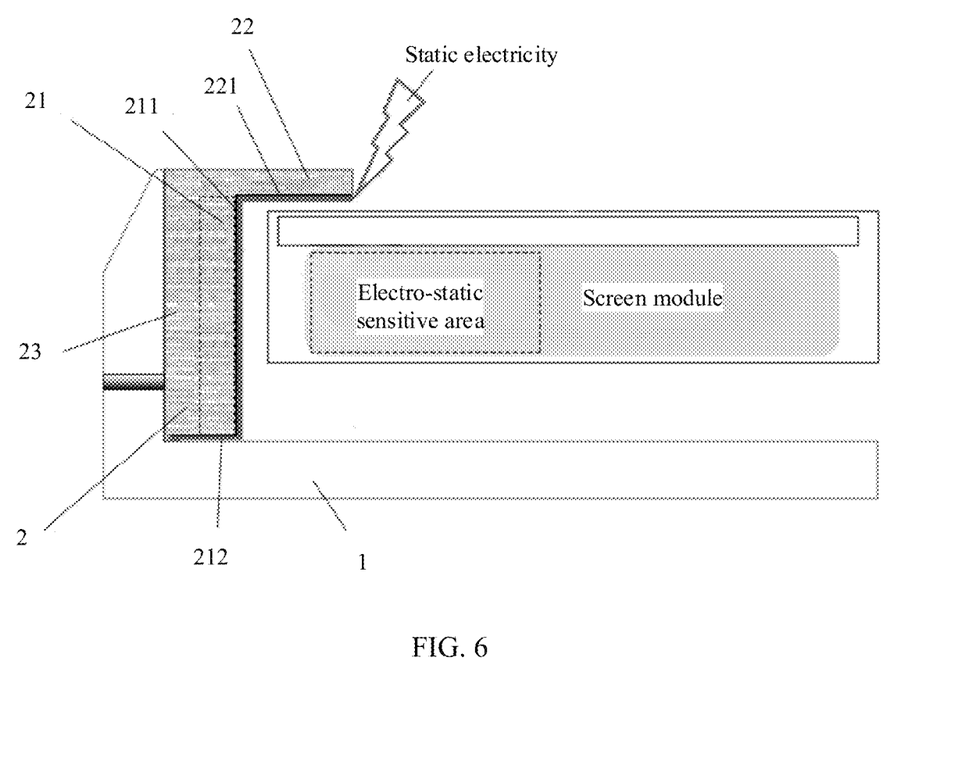
FIG. 6 is a schematic diagram of a specific disposing manner of assembly of a screen module according to this application.

FIG. 5 is a schematic sectional view of assembly of another screen module according to this application. FIG. 6 is a schematic diagram of a specific disposing manner of assembly of another screen module according to this application. A difference between a structure shown in FIG. 5 and FIG. 6 and a structure shown in FIG. 2 to FIG. 4 lies in that the metal housing 1 does not include the metal partition wall 11. The junction surface 212 is connected to the metal housing 1.

Figure 7:
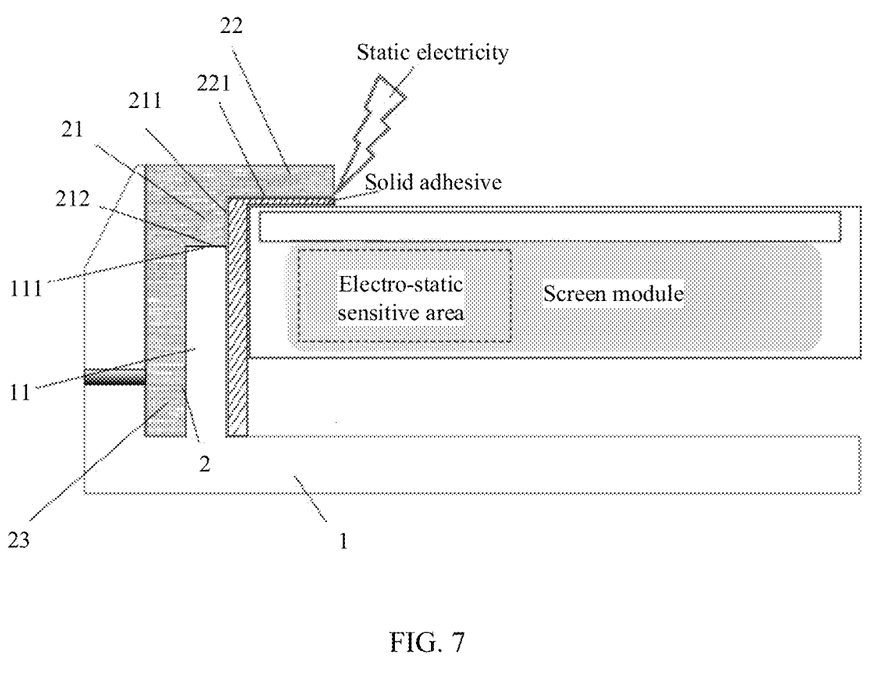
FIG. 7 is a schematic diagram of an insulative electro-static discharge protection structure according to this application.

FIG. 7 is a schematic diagram of an insulative electro-static discharge protection structure according to this application. As shown in FIG. 7, a second surface 221, a first surface 211, and a side, facing a screen module, of a metal partition wall 11 are bonded to the screen module with solid adhesive. The solid adhesive has high compactness and is not easily broken down by static electricity. However, because insulation performance completely depends on a width of the adhesive, to achieve a good insulation effect, a width of a black edge of a screen may increase and affect appearance of the electronic device.

At present, an antenna of an electronic device is usually designed on a side of a side edge of the screen module. Enough wide space (for example, a clearance area) around the antenna of the electronic device is to be provided, without shielding or interference, to enable radiation intensity of signals at 360° in all directions at a cross section of the antenna to be the same, achieving a best communication effect.

Figure 8:
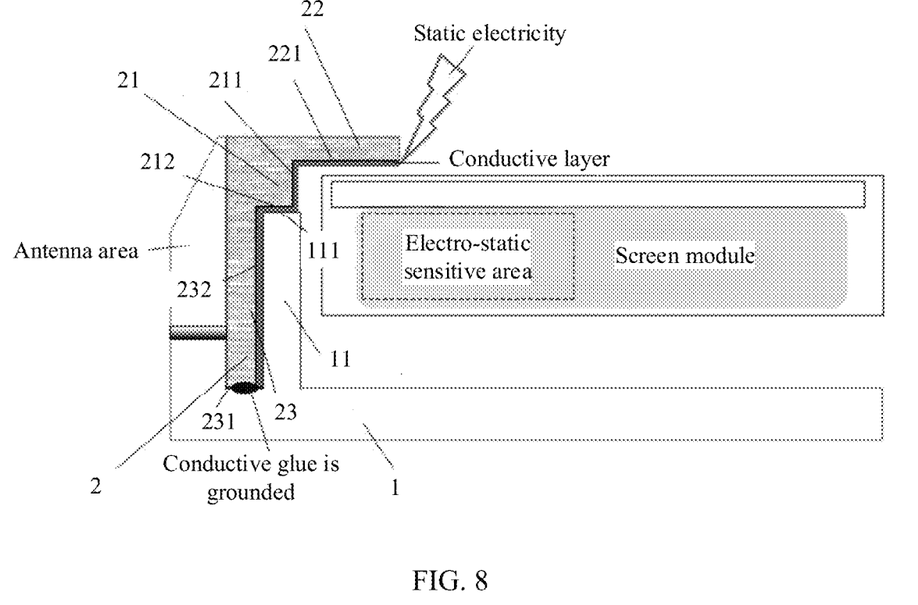
FIG. 8 is a schematic diagram of a grounding electro-static discharge protection structure according to this application.

FIG. 8 is a schematic diagram of a grounding electro-static discharge protection structure according to this application. As shown in FIG. 8, a second side edge 23 includes a third surface 231 facing a side of a metal housing 1 and a fourth surface 232 facing a side of a screen module. A continuous conductive layer is disposed on a second surface 221, a first surface 211, a junction surface 212, and a fourth surface 232. Conductive adhesive is disposed between the third surface 231 and the metal housing 1, and the conductive layer is connected to the metal housing 1 with the conductive adhesive. When entering from a side edge of the screen module, charges of static electricity are conducted to the conductive adhesive along the conductive layers, then conducted to the metal housing 1 with the conductive adhesive, and finally discharged by grounding. Therefore, in a process of manufacturing the electro-static discharge protection structure, the conductive adhesive is dispensed at a bottom of a groove formed by the metal partition wall 11 and the metal housing 1. An existing manufacturing process does not guarantee uniformity and compactness of dispensing. To ensure performance and a degree of adhesion of the conductive adhesive, when the adhesive is dispensed in a groove with a specific depth, an amount of the conductive adhesive may increase a width of a black edge of a screen. This affects competitiveness on appearance of a product. In addition, because an antenna area is disposed on a side, opposite to the screen module, of a border frame 2, an antenna is disposed away from a component that causes interference as much as possible, to prevent harmonic interference caused by the component to the antenna. According to the electro-static discharge protection structure shown in FIG. 8, because the antenna area is close to grounding positions of the conductive layer and the conductive adhesive, an RSE risk is easily caused by poor grounding, and antenna performance is affected.

A discharge in a gap includes two metal electrodes. One electrode is fastened to an insulator, the other electrode is connected to a grounding apparatus through an auxiliary gap, and a specified gap distance is maintained between the two electrodes. When an instantaneous overvoltage strikes, the gap is broken down, and a part of overvoltage charges are introduced into the ground. This prevents a voltage on a protected device from rising.

Figure 9:
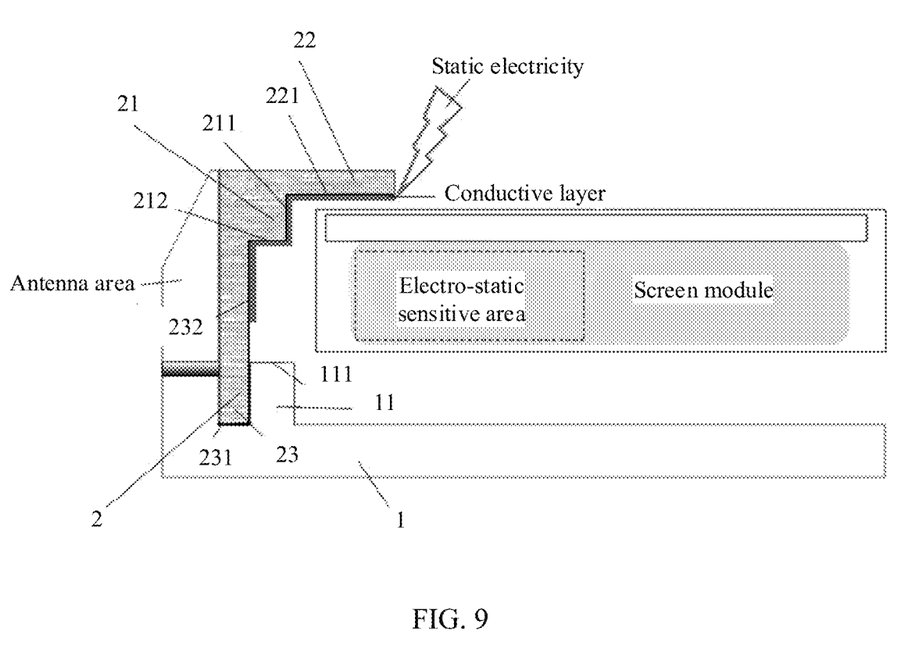
FIG. 9 is a schematic diagram of another grounding electro-static discharge protection structure according to this application.

FIG. 9 is a schematic diagram of another grounding electro-static discharge protection structure according to this application. As shown in FIG. 9, the structure discharges static electricity in a manner of discharge in a gap. A continuous conductive layer is disposed on a second surface 221, a first surface 211, a junction surface 212, and a fourth surface 232. A conductive layer disposed on the fourth surface 232 extends from one end, away from a metal housing 1, of the second side edge 23 to a middle position of the second side edge 23, and is equivalent to an electrode fastened to an insulator. A specified gap distance is maintained between the conductive layer on the fourth surface 232 and a metal partition wall 11 for discharge in a gap. The metal partition wall 11 and the metal housing 1 are connected and grounded to discharge the static electricity. The metal partition wall 11 is equivalent to an electrode connected to a grounding apparatus through an auxiliary gap. When the static electricity enters from a side edge of a screen module, charges of the static electricity are conducted along the conductive layer to break down the gap, conducted to the metal housing 1 through the metal partition wall 11, and discharged by grounding.

Secondary discharge means abnormal discharge on a machined surface due to intervention of a pitting corrosion product and the like. During this abnormal discharge, arc sparks are produced. Such secondary discharge in an electronic device may cause a problem of freezing or poor call quality of a mobile phone. An existing technology of mounting a conductive layer is not advanced when the conductive layer is disposed. Taking a conductive copper sheet as an example, in the electro-static discharge protection structure shown in FIG. 9, the conductive layer on the fourth surface 232 extends from the one end, away from the metal housing 1, of the second side edge 23 to a middle position of the fourth surface 232. A specific gap is left between the conductive layer and the metal partition wall 11. If the conductive layer is made of the conductive copper sheet, when the electro-static discharge protection structure is disposed in the electronic device, due to limitations of the mounting technology, the conductive copper sheet is not fastened at a middle position and easily curls. When curling, the conductive copper sheet may be in contact with the metal partition wall 11, resulting in the secondary discharge.

To solve the problems in a conventional technology, this embodiment of this application illustrates the electro-static discharge protection structure. According to the electro-static discharge protection structure, static electricity on a side edge of the screen module is effectively discharged, electro-static discharge protection is effectively provided for each side edge of the screen module, antenna performance is ensured, an RSE risk caused by poor grounding in the conventional technology is prevented, and an impact on antenna performance is prevented, and a risk of secondary discharge is further prevented.

Figure 10:
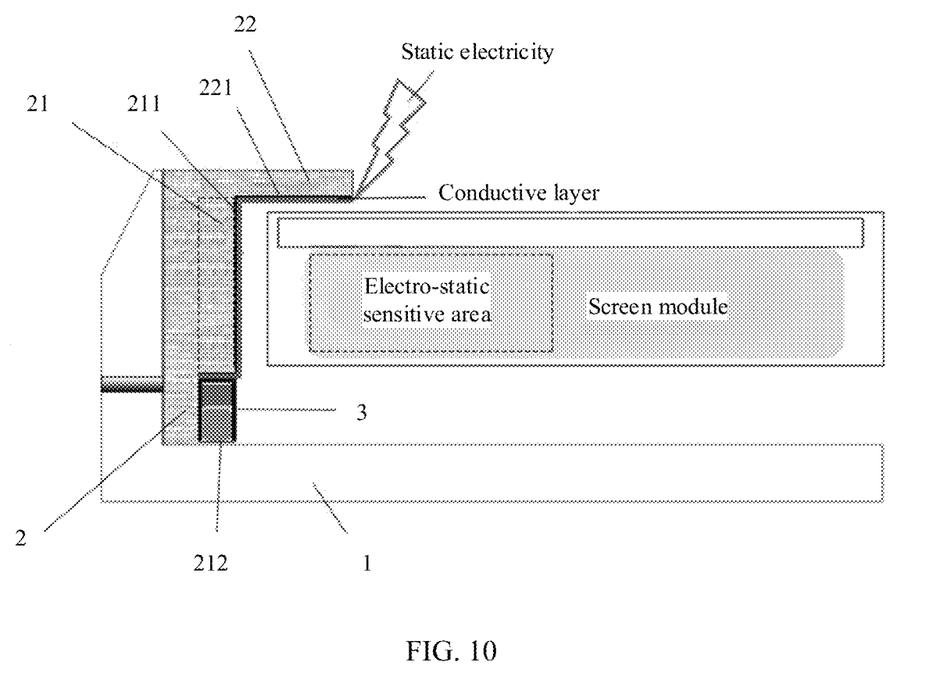
FIG. 10 is a schematic diagram of an electro-static discharge protection structure according to an embodiment of this application.

FIG. 10 is a schematic diagram of an electro-static discharge protection structure according to an embodiment of this application. As shown in FIG. 10, the electro-static discharge protection structure provided in this application includes a metal housing 1, a border frame 2, and a pressure-sensitive elastic component 3. One end of the pressure-sensitive elastic component 3 is connected to the metal housing 1, the other end of the pressure-sensitive elastic component 3 extends in a direction away from the metal housing 1, and a screen module is disposed on a side of the pressure-sensitive elastic component 3. The border frame 2 includes a connection part 21 and a first side edge 22. The connection part 21 is disposed at one end, away from the metal housing 1, of the pressure-sensitive elastic component 3. The connection part 21 includes a first surface 211 facing the screen module. The first side edge 22 is disposed on a side, facing the screen module, of the connection part 21. The first side edge 22 includes a second surface 221 facing the screen module. A conductive layer is disposed on a side, facing the pressure-sensitive elastic component 3, of the connection part 21, the one end of the pressure-sensitive elastic component 3 is connected to the conductive layer, the other end of the pressure-sensitive elastic component 3 is connected to the metal housing 1, and the conductive layer also continuously extends along the first surface 211 to the second surface 221. When there is no static electricity, the pressure-sensitive elastic component 3 may be conductive only on at a high voltage. Therefore, a low voltage current may not be conducted to the metal partition wall 11 through the pressure-sensitive elastic component 3. This prevents an impact of an RSE risk caused by conventional poor grounding, on antenna performance. When the static electricity enters a side edge of the screen module, because of a high voltage of the static electricity, the static electricity is conducted to the pressure-sensitive elastic component 3 through the conductive layer, and then conducted to the metal housing 1, thereby being discharged by grounding. It should be noted that the pressure-sensitive elastic component 3 includes: a pressure-sensitive device 31 and an elastic conductor 32. The pressure-sensitive device 31 is a device that can clamp a voltage when a circuit bears an overvoltage. The pressure-sensitive device 31 is not conductive when there is no static electricity, and is conductive when there is the static electricity. Therefore, after the static electricity is conducted, a clamping voltage is extremely small, so that a peak current caused by secondary discharge is reduced, and a risk of secondary discharge is prevented. The elastic conductor 32 may absorb a gap tolerance. This improves reliability of overlapping, and reduces damage of a structural stress to the pressure-sensitive device 31.

Figure 11:
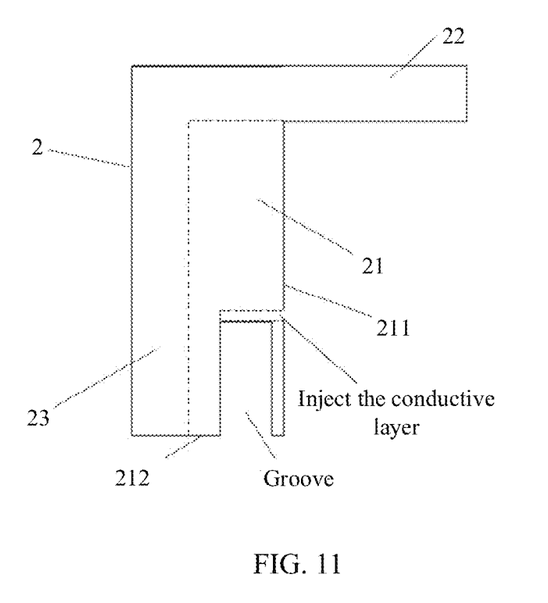
FIG. 11 is a schematic diagram of a disposing manner of a groove on a junction surface according to an embodiment of this application.

FIG. 11 is a schematic diagram of a disposing manner of a groove on a junction surface according to an embodiment of this application. As shown in FIG. 10 and FIG. 11, the connection part 21 includes a junction surface 212 attached to the metal housing 1. A groove is disposed on the junction surface 212. The conductive layer is disposed at a bottom of the groove, the pressure-sensitive device 31 and the elastic conductor 32 are disposed in the groove. One end of the pressure-sensitive device 31 is connected to the conductive layer in the groove, the other end of the pressure-sensitive device 31 is connected to one end of the elastic conductor 32, and the other end of the elastic conductor 32 is connected to the metal housing 1. It should be noted that, as shown in a dashed-line box at the bottom of the groove in FIG. 11, a window that is used to inject the conductive layer is disposed on the connection part 21, to facilitate the injection of the conductive layer and enable one end of the pressure-sensitive device 31 to be connected to the conductive layer.

Figure 12:
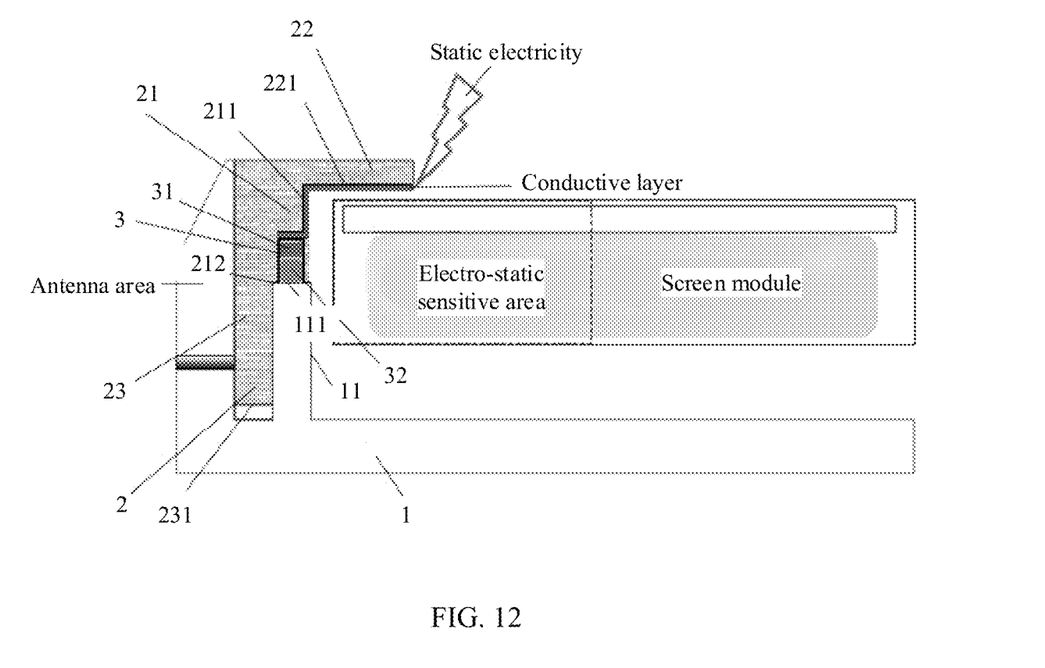
FIG. 12 is a schematic diagram of an electro-static discharge protection structure according to an embodiment of this application.

FIG. 12 is a schematic diagram of an electro-static discharge protection structure according to an embodiment of this application. As shown in FIG. 12, in an implementation, a metal housing 1 includes a metal partition wall 11. One end of the metal partition wall 11 is connected to the metal housing 1, and the other end of the metal partition wall 11 extends in a direction away from the metal housing 1. A pressure-sensitive elastic component 3 is connected to one end, away from the metal housing 1, of the metal partition wall 11. The metal partition wall 11 is perpendicular to the metal housing 1. The metal partition wall 11 includes but is not limited to a solid cuboid or a hollow cuboid. When the metal partition wall 11 is the solid cuboid, a manufacturing process is simple, and the metal partition wall is easily poured and conductive entirely. When the metal partition wall 11 is the hollow cuboid, some of materials are reduced in a manufacturing process, and this facilitates heat dissipation of the screen module. The connection part 21, the pressure-sensitive elastic component 3, and the metal partition wall 11 are disposed on a same plane. In actual arrangement, heights of the connection part 21, the pressure-sensitive elastic component 3, and the metal partition wall 11 may be adaptively set based on a setting requirement of an electronic device.

In an implementation, the first side edge 22 and the second side edge 23 are perpendicularly disposed in an L-shape, and the connection part 21 is disposed at a corner of the L-shape. The first surface 211 and a side edge, facing a side of the screen module, of metal partition wall 11 are located on a same plane. The metal housing 1, the metal partition wall 11, the first surface 211, and the second surface 221 form space for accommodating the screen module. A side edge, opposite to the screen module, of the metal partition wall 11 and the metal housing 1 form a rectangular groove, and the rectangular groove is clamped to the second side edge 23.

Figure 13:
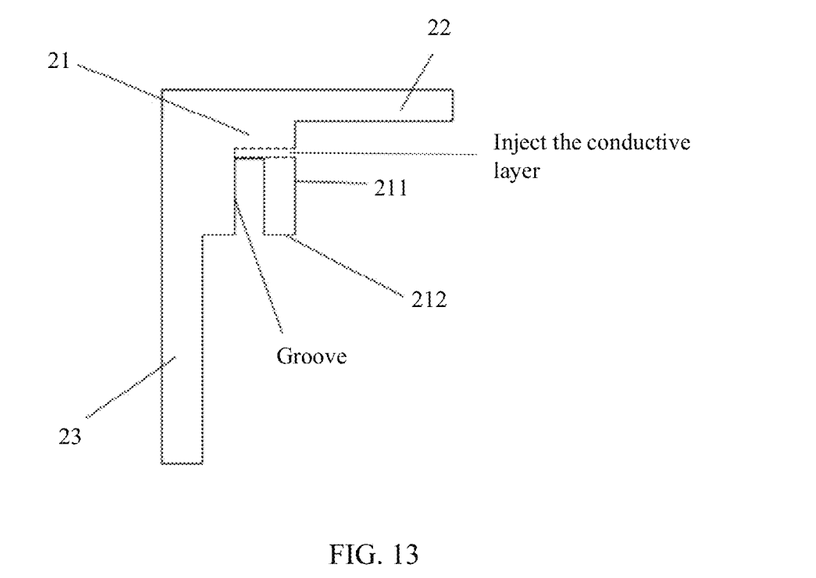
FIG. 13 is a schematic diagram of a disposing manner of a groove on a junction surface according to an embodiment of this application.

FIG. 13 is a schematic diagram of a disposing manner of a groove on a junction surface according to an embodiment of this application. As shown in FIG. 12 and FIG. 13, in an implementation, an end surface 111 is formed at the one end, away from the metal housing 1, of the metal partition wall 11. The connection part 21 includes a junction surface 212 attached to the end surface 111. A groove is disposed on the junction surface 212. The conductive layer is disposed at a bottom of the groove. The pressure-sensitive device 31 and the elastic conductor 32 are disposed in the groove. One end of the pressure-sensitive device 31 is connected to the conductive layer in the groove, the other end of the pressure-sensitive device 31 is connected to one end of the elastic conductor 32, and the other end of the elastic conductor 32 is connected to the end surface 111. In the implementation, the pressure-sensitive elastic component 3 may be disposed on a border frame 2. When the static electricity enters from a side edge of a screen, the static electricity is directly conducted to the pressure-sensitive device 31 through the conductive layer, then conducted to the metal partition wall 11 through the elastic conductor 32, and then discharged through the metal housing 1 by grounding. In the disposing manner, the static electricity is directly conducted to the pressure-sensitive device 31, so that the pressure-sensitive device 31 has a better effect of clamping a voltage. It should be noted that, as shown in a dashed-line box at the bottom of the groove in FIG. 13, a window that is used to inject the conductive layer is disposed on the connection part 21, to facilitate the injection of the conductive layer and enable one end of the pressure-sensitive device 31 to be connected to the conductive layer.

In an implementation, the second side edge 23 further includes a third surface 231. The third surface 231 is disposed on a side, facing the metal housing 1, of the second side edge 23. There is a gap between the third surface 231 and the metal housing 1. In the implementation, the pressure-sensitive elastic component 3 is disposed between the connection part 21 and the metal partition wall 11, so that the pressure-sensitive elastic component 3 is not conductive when there is no static electricity, and is conductive when there is the static electricity, and the metal partition wall 11 plays a role in clamping. Therefore, the third surface 231 does not need to be closely attached to the metal housing 1, the border frame 2 and the metal housing 1 do not need to be fastened with adhesive. When the metal partition wall 11 performs clamping, the metal partition wall 11 is not conductive when there is no static electricity. This prevents an increase of a width of a black edge of a screen caused when fastening to the metal housing 1 with the conductive adhesive, and prevents a problem of an RSE risk possibly caused by poor grounding with the conductive adhesive and further affecting antenna performance.

Figure 14:
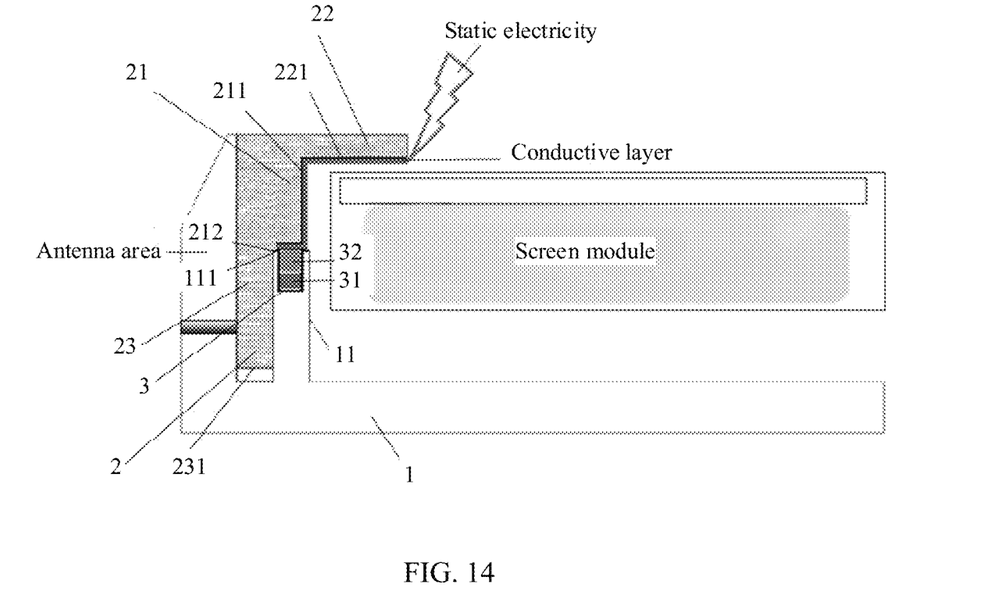
FIG. 14 is a schematic diagram of a disposing manner of another pressure-sensitive elastic component according to an embodiment of this application.
Figure 15:
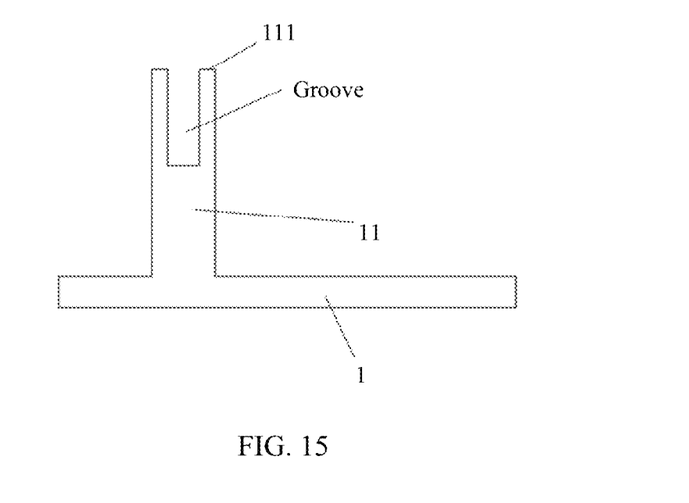
FIG. 15 is a schematic diagram of a disposing manner of a groove on an end surface according to an embodiment of this application.

FIG. 14 is a schematic diagram of a disposing manner of another pressure-sensitive elastic component according to an embodiment of this application. FIG. 15 is a schematic diagram of a disposing manner of a groove on an end surface according to an embodiment of this application. As shown in FIG. 14 and FIG. 15, in an implementation, a groove is disposed on the end surface 111. A conductive layer is disposed at a top of the groove. A pressure-sensitive device 31 and an elastic conductor 32 are disposed in the groove. One end of the pressure-sensitive device 31 is connected to a bottom of the groove, the other end of the pressure-sensitive device 31 is connected to one end of the elastic conductor 32, and the other end of the elastic conductor 32 is connected to the conductive layer. In the implementation, the pressure-sensitive elastic component 3 may be disposed on the metal partition wall 11. Because the metal housing 1, the metal partition wall 11, and the groove disposed on the end surface 111 may be integrally poured in an actual manufacturing process, this manner is simpler in the manufacturing process.

In an implementation, a border frame 2 includes at least any one of the following materials: a metal material and an insulating material. In a manufacturing process, the border frame 2 of the electronic device may be manufactured based on needs of different user groups. The electro-static discharge protection structure illustrated in this application may be applied to a variety of materials of the border frame. A metal border frame may improve overall texture of the electronic device, an insulation border frame may provide a better radio frequency radiation capability and reduce an impact on the antenna performance.

In an implementation, the conductive layer is disposed in at least any one of the following manners: spraying, transferring, and electroplating. In the implementation, in the actual manufacturing process, the conductive layer may be disposed based on a shape and a material of the electronic device.

In an implementation, the pressure-sensitive device 31 includes at least any one of the following materials: a transient diode and a pressure-sensitive resistor. The transient diode is a high-performance protection device in a form of a diode, with characteristics of fast response time, high transient power, a low leakage current, and a small breakdown voltage deviation. The pressure-sensitive resistor may perform effective high-voltage transient voltage suppression, so that costs of the device are effectively reduced and an overall design is optimized.

In an implementation, the elastic conductor 32 includes at least any one of the following materials: conductive foam and silicone. In the implementation, a plurality of materials may be selected as materials of the elastic conductor.

In an implementation, the conductive layer includes at least any one of the following materials: conductive silver paste, a conductive copper sheet, conductive graphite, and conductive fabric. In this way, based on specific disposing of the electro-static discharge protection structure, a plurality of materials may be selected as materials of the conductive layer.

In an implementation, the metal housing 1 is configured to implement grounding. In this way, static electricity is discharged by grounding through the metal housing 1.

In an implementation, an antenna area is disposed on a side, opposite to the screen module, of the border frame 2. Due to a demand for a signal strength, an antenna is usually disposed near the border frame 2. An antenna area is disposed near the border frame 2, so that better radio frequency radiation is provided.

An embodiment of this application further provides an electronic device. The electronic device includes the electro-static discharge protection structure provided in the foregoing embodiments. The electronic device may include, for example, a mobile terminal, a tablet computer, a personal computer, a workstation device, a large screen device (for example, a smart screen and an intelligent television), a handheld game console, a home game console, a virtual reality device, an augmented reality device, a mixed reality device, an intelligent vehicle terminal, a self-driving vehicle, customer-premises equipment (customer-premises equipment, CPE), and the like.

According to the electronic device, when there is no static electricity, the pressure-sensitive elastic component 3 may be conductive only at a high voltage. Therefore, a low voltage current may not be conducted to the metal partition wall 11 through the pressure-sensitive elastic component 3. This prevents an RSE risk caused by conventional poor grounding, and further prevents affecting of antenna performance. When the static electricity enters a side edge of the screen module, because of a high voltage of the static electricity, the static electricity is conducted to the pressure-sensitive elastic component 3 through the conductive layer, conducted to the metal partition wall 11, and then conducted to the metal housing 1 through the metal partition wall 11, and thereby being discharged by grounding.

What is claimed is:

1. An electro-static discharge protection structure, comprising: a metal housing, a border frame, and a pressure-sensitive elastic component, wherein the pressure-sensitive elastic component comprises: a pressure-sensitive device and an elastic conductor;

wherein a first end of the pressure-sensitive elastic component is connected to the metal housing, a second end of the pressure-sensitive elastic component extends in a direction away from the metal housing, and a screen module is disposed on a side of the pressure-sensitive elastic component;

wherein the border frame comprises a connection part and a first side edge;

wherein the connection part is disposed at the second end of the pressure-sensitive elastic component, and the connection part comprises a first surface facing the screen module;

wherein the first side edge is disposed on a side, facing the screen module, of the connection part, and the first side edge comprises a second surface facing the screen module;

wherein a conductive layer is disposed on a side, facing the pressure-sensitive elastic component, of the connection part, the second end of the pressure-sensitive elastic component is connected to the conductive layer, the first end of the pressure-sensitive elastic component is connected to the metal housing, and the conductive layer also continuously extends along the first surface to the second surface; and wherein the metal housing comprises a metal partition wall, a first end of the metal partition wall is connected to the metal housing, and a second end of the metal partition wall extends in the direction away from the metal housing, and the pressure-sensitive elastic component is connected to the second end of the metal partition wall.

2. The electro-static discharge protection structure according to claim 1, wherein the metal housing and the metal partition wall are integrally formed.

3. The electro-static discharge protection structure according to claim 2, wherein the border frame further comprises a second side edge;

the second side edge is disposed on a side, opposite to the screen module, of the metal partition wall; and a first end of the second side edge is connected to the connection part, and a second end of the second side edge extends in a direction elese te toward the metal housing.

4. The electro-static discharge protection structure according to claim 3, wherein an end surface is formed at the second end of the metal partition wall, the connection part comprises a junction surface attached to the end surface, a groove extends in the junction surface, and the conductive layer is disposed at a bottom of the groove; and wherein the pressure-sensitive device and the elastic conductor are disposed in the groove, a first end of the pressure-sensitive device is connected to the conductive layer in the groove, a second end of the pressure-sensitive device is connected to a first end of the elastic conductor, and a second end of the elastic conductor is connected to the end surface.

5. The electro-static discharge protection structure according to claim 3, wherein an end surface is formed at the second end of the metal partition wall, the connection part comprises a junction surface attached to the end surface, a groove extends in the end surface, and the conductive layer is disposed at a top of the groove; and wherein the pressure-sensitive device and the elastic conductor are disposed in the groove, a first end of the pressure-sensitive device is connected to a bottom of the groove, a second end of the pressure-sensitive device is connected to a first end of the elastic conductor, and a second end of the elastic conductor is connected to the conductive layer.

6. The electro-static discharge protection structure according to claim 1, wherein the border frame comprises at least any one of the following materials: a metal material or an insulating material.

7. The electro-static discharge protection structure according to claim 1, wherein the pressure-sensitive device comprises at least any one of the following materials: a transient diode or a pressure-sensitive resistor.

8. The electro-static discharge protection structure according to claim 1, wherein the elastic conductor comprises at least any one of the following materials: conductive foam or silicone.

9. The electro-static discharge protection structure according to claim 1, wherein the conductive layer comprises at least any one of the following materials: conductive silver paste, a conductive copper sheet, conductive graphite, or conductive fabric.

10. The electro-static discharge protection structure according to claim 3, wherein the second side edge further comprises a third surface;

wherein the third surface is disposed on a side, facing the metal housing, of the second side edge; and wherein there is a gap between the third surface and the metal housing.

11. The electro-static discharge protection structure according to claim 1, wherein an antenna area is disposed on a side, opposite to the screen module, of the border frame.

12. An electronic device, comprising an electro-static discharge protection structure, wherein the electro-static discharge protection structure comprises: a pressure-sensitive elastic component comprising a pressure-sensitive device and an elastic conductor;

wherein a first end of the pressure-sensitive elastic component is connected to a metal housing, a second end of the pressure-sensitive elastic component extends in a direction away from the metal housing, and a screen module is disposed on a side of the pressure-sensitive elastic component;

wherein a border frame comprises a connection part and a first side edge;

wherein the connection part is disposed at the second end of the pressure-sensitive elastic component, and the connection part comprises a first surface facing the screen module;

wherein the first side edge is disposed on a side, facing the screen module, of the connection part, and the first side edge comprises a second surface facing the screen module;

wherein a conductive layer is disposed on a side, facing the pressure-sensitive elastic component, of the connection part, the second end of the pressure-sensitive elastic component is connected to the conductive layer, the first end of the pressure-sensitive elastic component is connected to the metal housing, and the conductive layer also continuously extends along the first surface to the second surface; and wherein the metal housing comprises a metal partition wall, and a first end of the metal partition wall is connected to the metal housing, and a second end of the metal partition wall extends in the direction away from the metal housing, and the pressure-sensitive elastic component is connected to the second end of the metal partition wall.

13. The electronic device according to claim 12, wherein the metal housing and the metal partition wall are integrally formed.

14. The electronic device according to claim 13, wherein the border frame further comprises a second side edge;

wherein the second side edge is disposed on a side, opposite to the screen module, of the metal partition wall; and wherein a first end of the second side edge is connected to the connection part, and a second end of the second side edge extends in a direction elese te towards the metal housing.

15. The electronic device according to claim 14, wherein an end surface is formed at the second end of the metal partition wall, the connection part comprises a junction surface attached to the end surface, a groove extends in the junction surface, and the conductive layer is disposed at a bottom of the groove; and wherein the pressure-sensitive device and the elastic conductor are disposed in the groove, a first end of the pressure-sensitive device is connected to the conductive layer in the groove, a second end of the pressure-sensitive device is connected to a first end of the elastic conductor, and a second end of the elastic conductor is connected to the end surface.

16. The electronic device according to claim 12, wherein the border frame comprises a metal material.

17. The electronic device according to claim 12, wherein the pressure-sensitive device comprises a transient diode.

18. The electronic device according to claim 12, wherein the pressure-sensitive device comprises a pressure-sensitive resistor.

19. The electronic device according to claim 12, wherein the border frame comprises an insulating material.

* * * * *